(12) United States Patent
Jacobsen et al.

(10) Patent No.: US 7,009,381 B2
(45) Date of Patent: Mar. 7, 2006

(54) ADAPTER METHOD AND APPARATUS FOR INTERFACING A TESTER WITH A DEVICE UNDER TEST

(75) Inventors: Chris R. Jacobsen, Fort Collins, CO (US); Phillip A. Driggers, Loveland, CO (US); John E. Siefers, Loveland, CO (US); Brent W. Thordarson, Fort Collins, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/685,327

(22) Filed: Oct. 10, 2003

(65) Prior Publication Data

US 2004/0108848 A1 Jun. 10, 2004

Related U.S. Application Data

(63) Continuation-in-part of application No. 10/103,392, filed on Mar. 21, 2002, now Pat. No. 6,828,773.

(51) Int. Cl.
*G01R 31/26* (2006.01)

(52) U.S. Cl. .................................. 324/158.1; 324/765

(58) Field of Classification Search ................ 324/765, 324/754, 755, 761, 762, 760, 73.1
See application file for complete search history.

(56) References Cited

U.S. PATENT DOCUMENTS

| | | | |
|---|---|---|---|
| 4,707,657 A | 11/1987 | Boegh-Petersen | |
| 5,109,596 A * | 5/1992 | Driller et al. | 29/705 |
| 5,457,380 A | 10/1995 | Blumanau | |
| 5,602,490 A * | 2/1997 | Blumenau | 324/754 |
| 5,896,037 A * | 4/1999 | Kudla et al. | 324/755 |
| 6,429,671 B1 * | 8/2002 | Duckworth et al. | 324/758 |
| 6,476,628 B1 | 11/2002 | LeColst | |
| 6,650,134 B1 | 11/2003 | Schein | |
| 2003/0197521 A1 | 10/2003 | Weimer | |

FOREIGN PATENT DOCUMENTS

| | | |
|---|---|---|
| EP | 0305734 | 8/1987 |
| EP | 0354080 | 2/1990 |
| GB | 2214362 A | 8/1989 |
| WO | WO98/21597 | 5/1998 |
| WO | WO98/53330 | 11/1998 |

* cited by examiner

*Primary Examiner*—Vinh Nguyen
*Assistant Examiner*—Tung X. Nguyen (57) ABSTRACT

A fixture assembly is presented. The fixture assembly includes a device interface assembly for mating with a device under test and a tester interface assembly for mating with the device interface assembly on one side and a tester on a second side. In the method and apparatus of the present invention, the device interface assembly includes a probe field specific to a device under test and may be changed to accommodate a different device, without changing the tester interface assembly. The tester interface assembly includes a custom electronic module and a standardized electronic module, which are both coupled to a PCB interface in the tester interface assembly. As such, both standardized and specialized test may be modified and changed without redesigning the tester interface assembly.

8 Claims, 5 Drawing Sheets

ADAPTER METHOD AND APPARATUS FOR INTERFACING A TESTER WITH A DEVICE UNDER TEST

CROSS REFERENCE TO RELATED APPLICATIONS

This invention is a continuation-in-part of patent application Ser. No. 10/103,392, filed on Mar. 21, 2002 now U.S. Pat. No. 6,828,773 and entitled Adaptor method and apparatus for interfacing a tester with a device under test.

BACKGROUND OF THE INVENTION

1. Field of the Invention

This invention relates to electronic systems. Specifically, the present invention relates to electronic test systems.

2. Description of the Related Art

Modern electronic systems are sophisticated and complex. As a result, supporting technology such as testing technology has increased in complexity. Electronic systems that once included hundreds or thousands of circuits now include millions of circuits. As a result, more sophisticated electronic testers are being deployed to test these electronic systems.

Modern electronic systems are often deployed in printed circuit boards (PCB's) or in integrated circuits with multiple analog and discrete components. Both the printed circuit boards and the integrated circuits include millions of devices (e.g. transistors, logic gates, etc). Since printed circuit boards and integrated circuits are relatively small in dimension, these devices are deployed within a small area. As a result, extremely sophisticated electronic testers are deployed capable of testing thousands of devices within a small area.

A conventional PCB has a number of layers that perform various functions. The layers may be made of a variety of materials, including conductive materials and dielectric materials depending on the function of the PCB. A conventional PCB board also includes thousands of connections between devices. The connections between devices are often referred to as traces. The traces serve as conduits for carrying electrical current between the devices. The traces are made of a conducting material such as copper. Vias communicate signals from trace to trace between the various layers. Areas of the conducting material, known as pads, are formed on both the topside of the PCB and the underside of the PCB. The pads are connected by the traces and function as mounting locations for the devices and as a point of contact for testing the PCB.

A conventional electronic test system typically includes a tester and a fixture. The fixture acts as an interface between the tester and the device under test (DUT) or unit under test (UUT). The fixture primarily stabilizes the DUT and routes test signals from the tester to the DUT. The tester interfaces with the DUT through the fixture and applies voltages and/or current through the fixture to different points on the DUT. During a test, the tester measures the trace current or a voltage to determine the quality of a signal path or the operational characteristics of a device. The tester typically uses software to control and automate the testing process.

Conventional test systems include wired and wireless fixtures. Fixtures include a probe plate for holding a plurality of probes (e.g. known as a probe pattern or a probe field). The probes provide an electrical pathway from the tester to the DUT. The probes are held in place by the probe plate, which is positioned between the DUT and the tester. The probes make contact with the underside of the DUT on pads. Oppositely disposed ends of the probes are positioned to make contact with the tester through wiring or a PCB in the fixture.

The tester includes a uniform pattern of tester contact points. The tester contact points provide an electrical pathway for test signals generated from the tester. For example, in a conventional tester, the tester contact points are nails with serrated heads. The tester contact points are connected to the internal electronics in the tester. A conventional fixture such as a wired fixture is in contact with the tester contact points. An electrical pathway is established between the wired fixture and the tester contact points through pins known as personality pins. The personality pins are single-ended wire-wrap pins that are mounted in the bottom of a probe plate in the wired fixture. The personality pins make contact with the tester contact points and provide a connection point (e.g. wire-wrap tail), to make a wire connection inside the fixture.

In a wired fixture, the personality pins and the probes are located within proximity of each other in the fixture. Wires are connected between the personality pins and the probes. The wires are wrapped around the personality pins at one end and wrapped around the tester contact points at the other end. As a result, an electrical pathway for testing is established between the tester and the DUT. The electrical pathway begins at the internal electronics of the tester, runs through the tester contact points, through the personality pins and across the wire connection to the probes, which make contact with pads on the underside of the DUT.

As the numbers of devices on PCB's have increased and the sizes of the PCB's have decreased, it has become difficult to position probes and connect wires within a fixture. For example, it may be necessary to position probes on a DUT that has more than 5000 test locations. As a result, more than 5000 wires may need to be wire-wrapped in the fixture to establish the electrical connection between the tester and the DUT. This massive amount of wire results in an incredible amount of congestion in a very small area. In addition if there is a malfunction or mis-wired connection, it is very difficult to identify a dysfunctional wire. Therefore trouble-shooting becomes a problem.

As a result, a more modern fixture assembly evolved which attempts to eliminate the need for wires in a fixture. This more recent version of the fixture is often referred to as a wireless fixture. In the more recent version, a fixture houses probes, which are used to engage pads on the underside of a DUT. A fixture PCB board or wireless PCB is positioned within the fixture and located on an oppositely disposed end of the probes. The wireless PCB includes a plurality of trace patterns for conducting electrical signals within the PCB between pads on both the topside and underside of the wireless PCB. Contact is made between the tester and the underside of the wireless PCB. As a result, an electrical pathway is established between the tester and the wireless PCB. The test signals are routed through the various trace patterns within the wireless PCB. Probes then make contact with the topside of the wireless PCB and an electrical pathway is established between the wireless PCB and the DUT. Ultimately, using the wireless PCB, an electrical pathway is established from the tester, through the wireless PCB, to the DUT.

In order to establish a good electrical pathway, the components of the fixture such as the wireless PCB must be positioned accurately. In a conventional wireless fixture, the wireless PCB is screwed down to hold the wireless PCB in place and support the PCB over the surface of the board.

Stabilizing the wireless PCB by using screws to connect the wireless PCB to the fixture, introduces a significant number of problems. For example, there are initial fixture design and assembly problems.

The screws are placed so that they avoid the probe pattern and then traces are routed in the wireless PCB to avoid the screws. In addition, the screws are placed into the wireless PCB and fastened in a coordinated manner so that unbalanced forces don't appear in the Wireless PCB. Unbalanced forces may introduce fractures in the PCB, cause signal path breaks, or create misalignments; therefore, every attempt is made to avoid these unbalanced forces. For example, the screws are placed in the wireless PCB in a specific order and are tightened a quarter turn at a time.

In addition, placing screws into the wireless PCB introduces a tremendous amount of processing overhead. Screws are typically required where the probe density is very high to stabilize the wireless PCB. However, a high density of traces is also required, where the probe density is high. As a result, it becomes very hard to place the screws, when you have a high concentration of traces that need to be routed in and around a highly concentrated area of probes. The competing interest of probe density versus screw placement often results in excessive PCB costs.

As mentioned earlier, the screws in a wireless PCB have to be placed so that they don't interfere with the probe pattern. Traces are then added around the screw locations as part of a routing process during the design of the PCB. The placement of the screws is a manual operation and trace routing is significantly hindered by the existence of the screws. Both the manual intervention and trace routing difficulties caused by the screws during initial fixture fabrication, add significant costs of manufacture to the fixture.

In addition, the repair and maintenance of a conventional fixture is a large manual operation. Repairs often require taking the screws out of the wireless PCB and putting the screws back into the wireless PCB, which is a difficult and time-consuming operation. In addition, since it is a task that requires a substantial amount of human intervention, repairs can introduce more problems and ultimately result in test errors.

Making changes to a conventional fixture is a very costly enterprise. Engineering Change Orders (ECO's) are changes to the fixture, which are typically driven by design changes to the DUT. These ECO's often involve rewiring of the fixture, which might require changes to the wireless PCB. As a result, there is processing overhead with these changes as well as the opportunity for error with these changes. The screws once again need to be removed, re-inserted, and then uniformly tightened to balance any loads on the wireless PCB board during ECO's.

In addition, since companies often require changes in the DUT, there are continual manual changes to the fixture and the wireless PCB. Long fixture implementation times, to accommodate the changes in the DUT, result in a delay in manufacturing time, product delivery, increased costs, etc. In addition, the wireless PCB has to be properly aligned to provide for proper targeting and good contacts between the probe's and the wireless PCB during these changes. If good contacts are not established between the wireless PCB and the probes, it is very difficult to tell whether the DUT is failing or whether there is a misalignment or bad probe contact in the fixture.

In addition to the issues associated with configuring testers for each individual test, as each DUT is tested, the tester must be reconfigured to work with each new DUT. Furthermore, test capability extensions for test that cannot be implemented by an unmodified tester may be necessary on the same DUT. To perform test requiring capability extensions, conventional methods make use of custom fixture electronics. Custom fixture electronics include PCBs that are specifically designed to perform a specific test. Currently, implementing custom fixture electronics requires that a fixture builder design a custom PCB to provide the functionality for a specific DUT test. The custom PCB must then be installed in the test fixture, in a specific manner. Specific test may then be generated using the custom PCB. However, should the need arise to perform other test or to test another DUT, the custom PCB is practically useless. A new custom PCB must be designed and developed to perform new test or test on a different DUT.

Thus, there is a need in the art for a method and apparatus that minimizes screws in a wireless PCB. There is a need in the art for a fixture that is easily repaired. There is a need in the art for a fixture that can easily accommodate changes. There is a need in the art for a fixture that is easily assembled, debugged, and maintained. There is a need for a method and apparatus that facilitates custom DUT design and testing.

SUMMARY OF THE INVENTION

A fixture assembly is presented. The fixture assembly includes a device assembly for mating with a device under test and a tester interface assembly for mating with the device assembly on one side and mating with a tester on an opposite side. The device assembly includes a probe field that changes with each device under test. The tester interface assembly includes a standardized probe field that mates with the tester. In the present invention, changes to the fixture may be accomplished by removing and replacing the device assembly, while using the same tester interface assembly.

In one embodiment of the present invention a fixture comprises a first assembly including a first probe field, the first probe field interfacing with a device. A second assembly mating with the first assembly, the second assembly mapping the first probe field to a second probe field, the second probe field interfacing with a tester.

In a second embodiment of the present invention a fixture comprises a probe plate including a first probe field, the probe plate houses a plurality of probes in the first probe field. A frame is positioned below the probe plate and maintains alignment of the probe plate. A load plate is positioned below the frame, wherein the plurality of probes extend through the load plate. An interface board is positioned below the load plate and in contact with the plurality of probes. A support plate is positioned below the interface board, the support plate providing support for the probe plate, the frame, the load plate and the interface board.

In a third embodiment of the present invention a fixture comprises, a probe plate including a second probe field, the probe plate houses a plurality of probes in the second probe field. A frame is positioned below the probe plate and maintains alignment of the probe plate. A load plate includes the second probe field. The load plate is positioned below the frame, and the probes extend through the load plate. An interface board is positioned below the load plate and in contact with the plurality of probes.

In a fourth embodiment of the present invention a fixture comprises a frame including a topside and an underside. A probe plate includes a second probe field, the probe plate is positioned relative to the topside of the frame, the probe plate houses a plurality of probes in the second probe field. A load plate is positioned relative to the underside of the frame. The plurality of probes extend through the load plate. An interface board is positioned relative to the underside of the frame, the interface board is in contact with the plurality of probes, which extend through the load plate.

In a fifth embodiment of the present invention a fixture comprises, a first probe plate including a first probe field. The first probe plate houses a first plurality of probes in the first probe field. A first frame is positioned below the first probe plate and maintains alignment of the first probe plate. A first load plate is positioned below the first frame. The first plurality of probes extend through the first load plate. A first interface board includes a topside and an underside, the first interface board is positioned below the first load plate and in contact with the first plurality of probes on the topside of the first interface board. A support plate is positioned below the first interface board, the support plate provides support for the first probe plate, the first frame, the first load plate and the first interface board.

A second probe plate is positioned below the support plate, the second probe plate includes a second probe field. The second probe plate houses a second plurality of probes in the second probe field. The second plurality of probes extend upward through the support plate and makes contact with the first interface board on the underside of the first interface board. A second frame is positioned below the second probe plate and maintains alignment of the second probe plate. A second load plate includes the second probe field. The second load plate is positioned below the second frame. The second plurality of probes extend through the second load plate. A second interface board is positioned below the second load plate and in contact with the second plurality of probes.

A method and apparatus for implementing custom electronics in a fixture is presented. In one embodiment, a standardized method and interface is utilized to implement custom electronics in a fixture. In another embodiment, a standardized method and interface is utilized to implement generic (i.e., standardized) electronics in a fixture.

Standardized interfaces are implemented in a wireless fixture to provide electronics resources. In one embodiment, a wireless fixture is presented. A location is provided in the wireless fixture on a tester interface board to house standard and custom fixture electronics modules that present the fixture electronics resources to a DUT. In a second embodiment, an interface board that includes a custom module and a standardized module is presented. Traces are routed on the interface board from the custom module and the standardized module to probes. The probes carry signals communicated from the standardized module and the custom module upward to the underside of a wireless PCB. The wireless PCB may then make the resources provided by the custom module and the standardized module available to a DUT, through double-ended receptacles containing spring-loaded probes, which provide a path from the topside of a wireless PCB to the DUT.

A fixture comprises a first assembly including a tester interface, the tester interface comprising a standardized test module providing standardized test resources and a custom test module providing specialized test resources; and a second assembly mating with the first assembly, the second assembly including a wireless interface coupled to the standardized test resources and to the custom test resources through a communication path.

A tester interface board comprises a standardized module comprising standardized electronics; a custom module comprising specialized electronics; and trace routes coupled to the standardized module and coupled to the custom module, the trace routes providing access to the standardized electronics and providing access to the specialized electronics.

A fixture comprises a first probe plate including a first probe field, the first probe plate capable of housing a plurality of double-ended probe receptacles in the first probe field; a wireless interface board including a topside and an underside, wherein the plurality of double-ended probe receptacles in the first probe field contact the wireless interface board on the topside; a second probe plate including a second probe field, the second probe plate housing a plurality of double-ended probe receptacles in the second probe field, wherein the plurality of double-ended probe receptacles in the second probe field contact the wireless interface on the underside; an interface board positioned below the second probe plate and in contact the plurality of double-ended probe receptacles in the second probe field; and a custom module coupled to the interface board, the custom module communicating test signals through the interface board to the plurality of double-ended probe receptacles in the second probe field.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
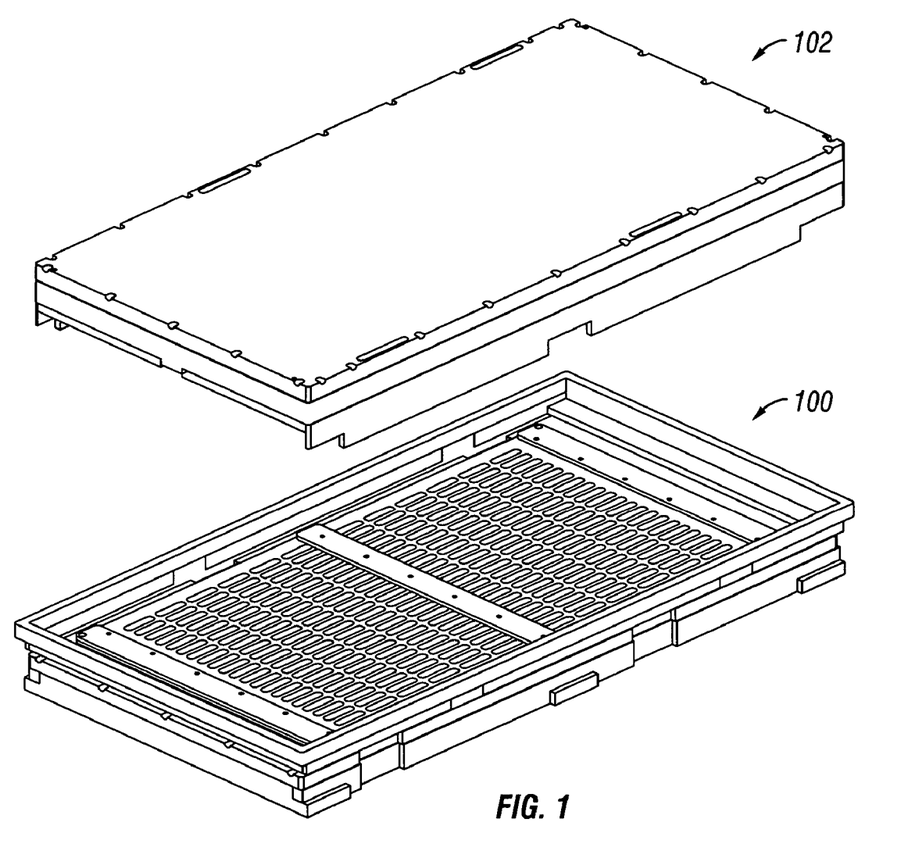
FIG. 1 is an exploded three-dimensional view of a fixture assembly, implemented in accordance with the teachings of the present invention.

FIG. 1 is an exploded three-dimensional view of a fixture assembly, implemented in accordance with the teachings of the present invention. The fixture assembly shown in FIG. 1 includes a device assembly 102 and a tester interface assembly 100. In the present invention, the tester interface assembly 100 is used to interface with a tester and standardized for the tester. The device assembly 102 is a specific interface that is used with a specific DUT. The device assembly 102 includes a probe plate with a probe field (e.g. probe pattern) designed to mate with a specific DUT. The tester interface assembly 100 includes a probe plate with a standardized probe pattern designed to mate with a tester.

The device assembly 102 is built to mate with a specific DUT. The device assembly 102, includes a multitude of probes formed in a pattern known as a probe field or probe pattern. The probe field in the device assembly 102 is designed to interface with the DUT. The device assembly 102 is designed to mate or interlock with the tester interface assembly 100. The tester interface assembly 100 has a standardized probe field that is designed to mate with a standard tester. As a result, electrical contact points in the tester, contact the tester interface assembly 100 and an electrical pathway is established between the tester and the tester interface assembly 100. The tester interface assembly 100 then interlocks with the device assembly 102. The device assembly 102 is designed such that an electrical pathway can be established between the tester interface assembly 100 and a DUT, through the device assembly 102.

Probe plates, which include a standardized probe field, are included in the tester interface assembly 100. The probe plates house a plurality of probes, which provide an electrical pathway from the tester, through the tester interface assembly 100. As mentioned above, the device assembly 102 also includes a probe plate that has a DUT specific probe pattern. Interlocking the tester interface assembly 100 with the device assembly 102 provides an electrical pathway. The probes in the tester interface assembly 100 contact the probes in the device assembly 102 through a wireless PCB board. As a result, an electrical pathway is established between the probes in the tester interface assembly 100 and the probes in the device assembly 102.

The device assembly 102 works in conjunction with the tester interface assembly 100, to map a standardized probe field to a DUT specific probe field. The probes in the tester interface assembly 100 are placed in a standardized (e.g. probe field which matches the testing device) probe field. The probes in the tester interface assembly 100 extend upward and make contact with the underside of a wireless PCB located in the device assembly 102. The probes in the device assembly 102 make contact with the topside of the wireless PCB to create an electrical pathway for test signals. The probes in the device assembly 102 are positioned in a probe field that maps to the DUT and are placed in contact with the DUT. As a result, the device assembly 102 re-maps the standardized probe field associated with the tester, to a DUT specific probe field associated with the DUT. In addition, an electrical pathway is established between the tester and the DUT.

The dimension of the fixture assembly is about 30 inches in length by 20 inches in width. The height of the fixture assembly when in the interlocked position is approximately 3–4 inches in height. However, it should be appreciated that these dimensions may be varied and still remain within the scope of the present invention.

Figure 2:
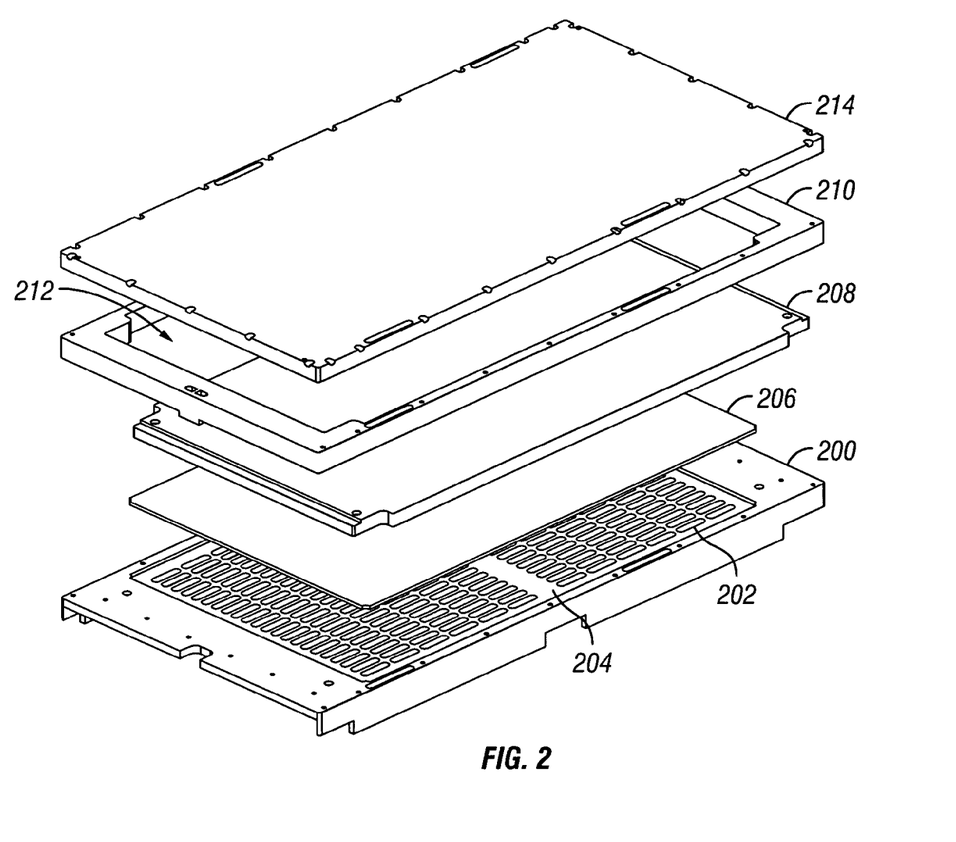
FIG. 2 is an exploded three-dimensional view of a device assembly.

In FIG. 2 an exploded three-dimensional view of a device assembly is shown. The device assembly of FIG. 2 corresponds to device assembly 102 of FIG. 1. The device assembly includes a number of interfaces as defined below.

A probe plate is shown as item 214. The probe plate 214 supports loads from probes that are mounted in the device assembly. The probe plate 214 is drilled with holes in a pattern that is compatible with the DUT. Probes (e.g. such as double-ended probes) are placed in these holes and form a probe field. The double-ended probes include a first end that engages (e.g. contacts) a DUT and an oppositely disposed end that engages (e.g. contacts) a wireless PCB located in the device assembly. Once the probes are placed in the holes the probes form a pattern of probes (e.g. probe field) specifically designed to make contact with the DUT.

A structural frame is shown as 210. The structural frame 210 provides structural support and alignment for the device assembly. In one embodiment of the present invention, the probe plate 214 is secured to the structural frame 210. An opening 212 is provided in the structural frame 210 to allow probes to extend downward through the structural frame 210 and make contact with interfaces positioned below the structural frame 210. The structural frame 210 is made from a sturdy lightweight material such as aluminum.

The structural frame 210 is a structural bridge between the probe plate 214 and the lower parts of the device assembly. The structural frame 210 further steadies and helps to locate the probe plate 214 relative to other parts of the device assembly. Lastly, the structural frame 210 functions to position and link all of the current carrying components, in the device assembly, to their respective contact points.

A load plate is shown as item 208. The load plate 208 is specific to the DUT. The load plate 208 is drilled with clearance holes so that probes are able to clear the load plate 208 and extend vertically through the load plate 208. As a result, the load plate 208 includes the same probe pattern as the probe plate 214. The load plate 208 is made of a composite material. The load plate 208 further protects the bottom end of the double-ended probes used in the device assembly. Lastly, the load plate 208 supports loading forces in the device assembly, that are generated by the tester interface assembly described below.

In one embodiment of the present invention there may be only 3,000 probes located in the device assembly pushing downward and 6,900 or more probes in the tester pushing upward. Therefore, there may be a substantial imbalance in the device assembly. The load plate 208 equalizes and supports the imbalance in forces.

An interface board such as a wireless PCB is shown as item 206. Contact is made on the topside of the wireless PCB 206 with probes mapped to a specific DUT. Contact is made on the underside of the wireless PCB 206 with probes mapped to the tester. As a result, the wireless PCB serves as an interface for re-mapping the standardized probe field of the tester, with a DUT specific probe field. The size of the wireless PCB 206 is such that its dimensions are within the size limiting criteria of the majority of PCB manufacturers. Limiting the size of the wireless PCB 206 reduces the final cost of fabrication for the component. In the present embodiment, the wireless PCB 206 is 22½ by 16½. However, it should be appreciated that these dimensions may be changed without departing from the scope or spirit of the invention.

The wireless PCB provides an easy mechanism for making changes. For example, changes can be made in the fixture assembly by soldering wires across the surface of the wireless PCB. In addition, the wireless PCB facilitates making design modifications to the DUT. When making modifications an operator can solder the correct pattern into the wireless PCB. In the meantime, the operator can take the wireless PCB design data back to the manufacturer and have the manufacturer develop a PCB based on the new pattern. While the manufacturer is making a new PCB, the operator can continue to test with the makeshift soldered PCB, until the new PCB is ready for use.

A PCB support plate is shown as item 200. The PCB support plate 200 is made of a sturdy metal such as aluminum. Since the PCB support plate 200 is in immediate proximity to the wireless PCB 206, the PCB support plate 200 must be non-conductive and therefore has a hard-anodized coating. The structural frame 210 and the PCB support plate 200 sandwich the wireless PCB 206 and the load plate 208 and keep the wireless PCB 206 in relative position to the other parts of the fixture.

The PCB support plate 200 includes an integrated grill pattern 202. Additional openings in the grill pattern allow for the new standardized and custom probes to pass through to a wireless PCB. In addition, a structural bridge 204 provides support for the grill pattern 202. Probes from the tester interface assembly extend upward from below and come through the grill pattern 202. The probes make contact with pads located on the underside of the wireless PCB 206.

Maintaining the relative position of the wireless PCB 206 enables the probes from above which extend through the load plate 208, to make contact with pads on the top side of the wireless PCB 206 and probes from below to extend upward through the grill pattern 202 and make contact with pads on the underside of the wireless PCB 206. The PCB support plate 200 also maintains mechanical alignment in the device assembly, when the device assembly is secured (e.g. pulled down into place) by the tester and forces are applied to the device assembly.

The PCB support plate 200 further provides structural support to the wireless PCB 206, when the fixture is off the tester. When the fixture is under test conditions, there are thousands of probes pushing upward and there are the hundreds/thousands of probes within the assembly pushing downward. Therefore forces are developed inside the device assembly. When the device assembly is off the tester the forces pushing upward are removed, therefore there is an imbalance of forces in the device assembly. The PCB support plate 200 and load plate 208 supports the PCB while the assembly is off of the tester, by bearing the load forces introduced by the imbalance.

In one embodiment of the present invention, the wireless PCB 206 is encapsulated between the load plate 208 and the PCB support plate 200. This is an advancement provided by the current design because the PCB, which is a critical component, is protected from degradation, damage or external influences. The external influences may include contamination from dirt and dust, impact damage from impaled objects and corrosion damage from environmental hazards.

In order to establish the proper contact with the probes and maintain alignment with the probes, the wireless PCB should maintain relative position to the other parts of the fixture. Therefore, the wireless PCB 206 must be held in position. The wireless PCB 206 is held in position by the structural frame 210, the load plate 208 and the PCB support plate 200. This is accomplished by sandwiching the wireless PCB 206 between the load plate 208 and the PCB support plate 200. In addition, the structural frame 210, the load plate 208 and the PCB support plate 200, support forces in the device assembly. As a result, the wireless PCB 206 is capable of supporting the load forces with support from the other interfaces in the device assembly.

The interfaces in the device assembly are positioned and referenced relative to the structural frame 210. The probe plate 214, which housed the plurality of probes, is referenced to the structural frame 210 via four or more dowel pins press-fit into the structural frame 210. The dowel pins protrude from the top surface of the structural frame 210 towards and into the probe plate 214. The structural frame 210 also provides similar referencing dowel pins for the load plate 208, the PCB support plate 200, and the wireless PCB 206. The dowel pins facilitate the referencing of the wireless PCB 206 relative to other interfaces in the assembly. The dowel pins protrude downwards towards the tester and fit into tight-fitting holes in the load plate 208, the PCB support plate 200, and the wireless PCB 206. The dowel pins that reference the position of the wireless PCB 206 and the PCB support plate 200 protrude downward and pass through loose-fitting holes in the load plate 208.

In the method and apparatus of the present invention, the dowels are used to precisely position the probe plate 214, the load plate 208, and the wireless PCB 206 relative to each other. The structural frame 210 provides a reference point for all interfaces and other components in the device assembly and is itself located via similar means to the tester interface assembly when it is mated to the tester interface assembly and pulled down during testing.

Figure 3:
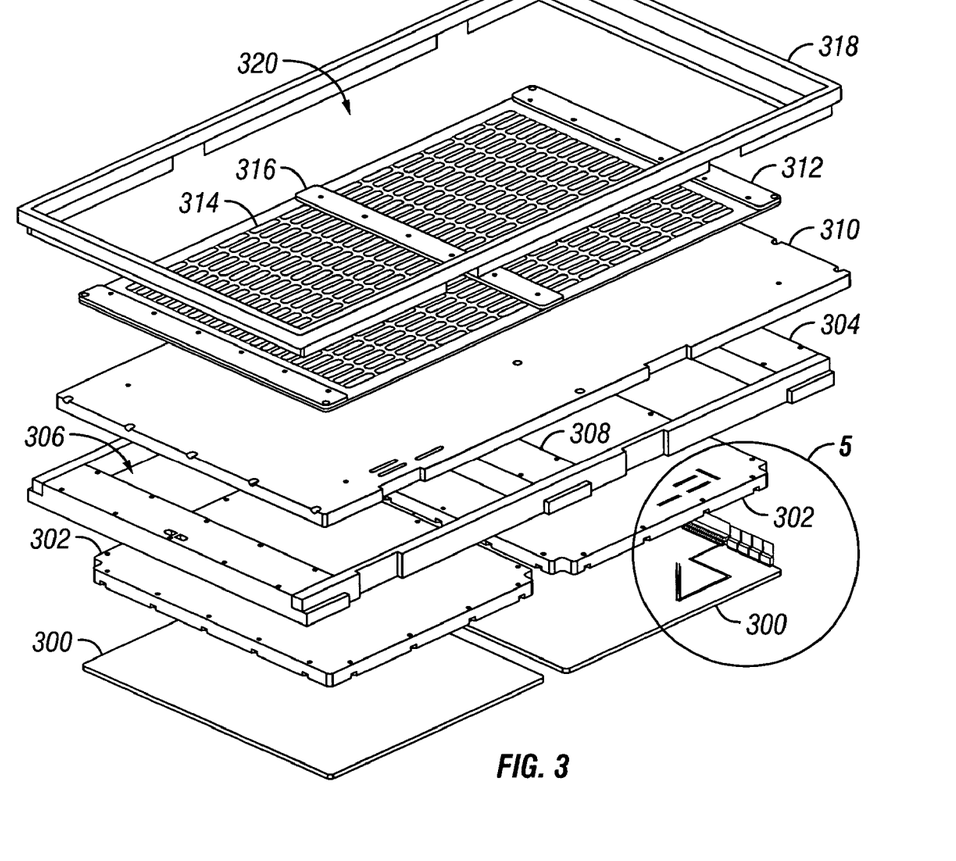
FIG. 3 is an exploded three-dimensional view of a tester interface assembly.

FIG. 3 displays a three-dimensional exploded view of the tester interface assembly shown as 100 of FIG. 1. A safety skirt is shown as item 318. An opening 320 is provided in the safety skirt 318 to facilitate contact between the tester interface assembly and the device assembly. The safety skirt 318 is a human factors safety device, which helps to avoid injury to an operator. When a tester pulls the tester interface assembly into place, there is a significant amount of downward force. The safety skirt covers any gaps between the tester interface assembly and the DUT assembly when the fixture assembly is not pulled down. As a result, the potential for operator injury is minimized when the fixture is being pulled down. The safety skirt 318 is made of a sturdy material such as aluminum or plastic.

A probe protection plate is shown as item 312. The probe protection plate 312 is a thin conductive interface that provides electrostatic discharge protection for the top of the tester (e.g. test head). Should an operator touch the probe protection plate 312, electrostatic charge is dissipated by the probe protection plate 312. As a result, the operator does not transmit charge (e.g. shock) to the test head. A pattern of holes 314, are located in the probe protection plate 312. The pattern of holes allows probes in a probe field to extend upward through the pattern of holes 314 and make contact with the fixture assembly. A crossbar member 316 helps to provide stability to the probe protection plate 312.

An interface probe plate is shown as item 310. The interface probe plate 310 is drilled with a standardized probe field to support double-ended probes. The standardized probe field is designed to enable the tester interface assembly to mate with a tester. The interface probe plate 310 is made of a composite material such as fiberglass and epoxy resin.

An interface frame is shown as 304. The interface frame is a structural frame that supports the tester interface assembly. In the present embodiment, the interface frame 304 is a five-part frame, including two end members, two side members and a bridge member 308. There are two openings 306, in the center of the frame that are separated by a bridge 308. The two openings enable the frame to align other parts of the assembly and enable the probes held by the probe plate 310 to extend through the interface frame 304 and make contact with a two-piece interface PCB 300. The interface frame 304 functions as a structural and alignment member of the tester interface assembly by holding all of the components in the tester interface assembly in relative alignment with each other. The interface frame 304 carries the load between the interface probe plate 310 above and other members of the tester interface assembly below. The interface frame 304 also protects the two-piece interface PCB 300 housed in the tester interface assembly.

The positions of the interfaces and components in the tester interface assembly are made relative to the interface frame 304. The interface probe plate 310, which contains a plurality of probes, is referenced to the interface frame 304 via four or more dowel pins press-fit into the interface frame 304. The dowel pins protrude from the top surface of the interface frame 304 towards and into tight-fitting holes in the interface probe plate 310. The interface frame 304 also provides similar referencing dowel pins for the two-piece interface load plate 302 and the two-piece interface PCB 300. As a result, the dowel pins enable the proper positioning of the two-piece interface PCB 300 relative to the other interfaces in the interface assembly fixture.

In the method an apparatus of the present invention the interface probe plate 310, the two-piece load plates 302 and the two-piece PCB 300 are precisely positioned relative to each other. The dowel pins protrude downwards towards the tester and fit into tight-fitting holes provided in the two-piece load plate 302 and the two-piece PCB 300. In addition, the two-piece PCB 300 is screwed or mechanically attached to the two-piece load plate 302. The interface frame 304 provides a reference point for all interfaces and other components in the tester interface assembly and is itself located via similar means to the tester when it is mated to the tester during testing.

A two-piece interface load plate is shown as item 302. The two-piece interface load plates 302 are identical mirror copies of each other. The two-piece interface load plates 302 are clearance drilled, so that the bottom end of a double-ended probe, held in the interface probe plate 310, can extend downward through the clearance drilled holes. The double-ended probes are mounted in the interface probe plate 310, extend through the openings in the interface frame 304 and pass-through the clearance holes in the two-piece load plates 302. The clearance holes in the interface load plates 302 are oversized so that the probes do not touch the holes in the load plate. The two-piece load plate 302 is made of a composite material.

Lastly, the two-piece PCB 300 in the tester interface assembly is anchored to the two-piece load plate 302.

The two-piece load plate 302 is used to support loading forces. For example, if the tester interface assembly is off of the test head, there are no tester interface probes pushing up from below, but there is still the full probe field of the double-ended probes pushing down from above. The two-piece load plate 302 supports the load of the probes in the probe field, pushing down from above.

A two-piece PCB is shown as 300. The two-piece PCB 300 are identical mirror copies of each other. The two-piece interface is standardized with respect to the tester. The two-piece PCB 300 serves as an interface, which maps the standard tester interface probe field to a more functional usable field relative to the wireless PCB 206 in the device interface assembly above. The two-piece PCB 300 is optimized for signal integrity and signal fidelity, so that an operator or end-user can maintain the same test quality whether using the assembly or not. The two-piece PCB 300 is made from a composite material with copper layers and traces.

Figure 4:
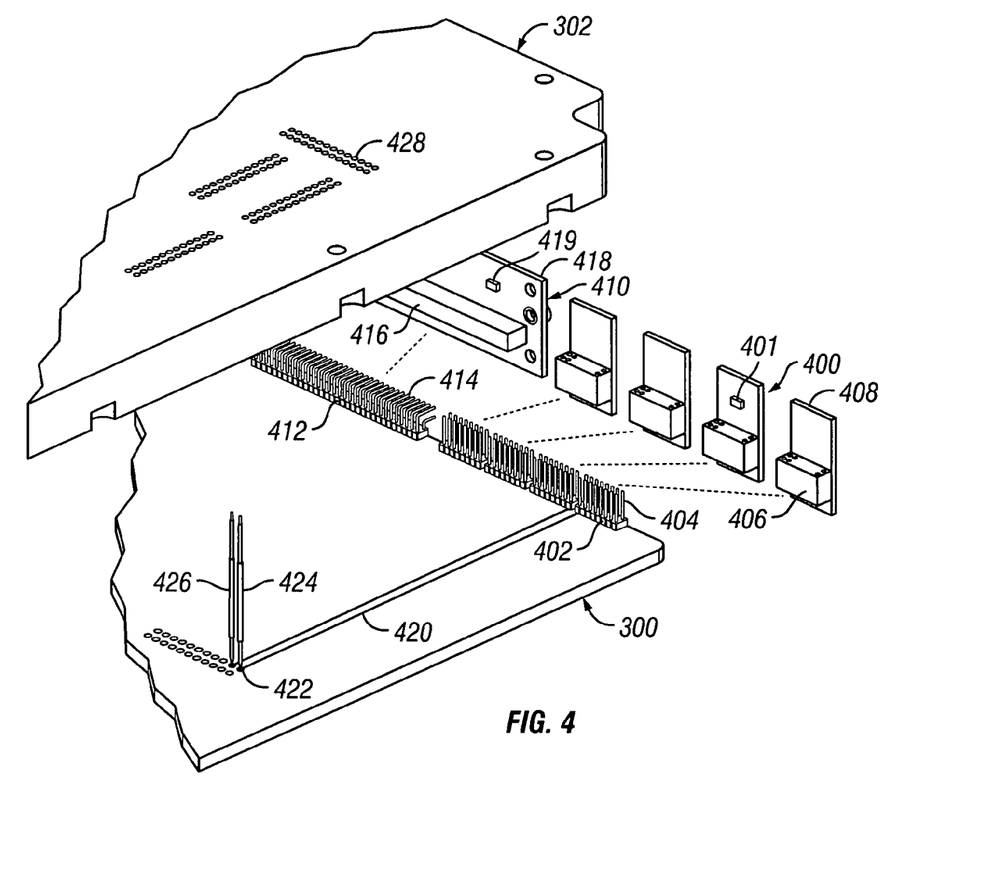
FIG. 4 is an exploded view of the PCB and load plate shown as item 5 in FIG. 3.

FIG. 4 is a magnified and exploded view of the PCB 300 and load plate 302 shown in FIG. 3. In FIG. 4, the PCB 300, such as the tester interface, and the load plate 302 are shown. In one embodiment of the present invention, computational electronics in addition to that provided by a tester is provided through modules connected to the tester. The computational electronics is used to generate test signaling to test a DUT in a fixture. The computational electronics includes both standardized electronics required for testing a DUT and custom electronics required to test a DUT. In one embodiment, custom electronics is implemented using a custom electronic module 400 and standardized electronics is implemented using a standardized electronic module 410. The custom electronic module 400 is used to generate customized test. The standardized electronic module 410 is used to generate standardized test.

In one embodiment, both the custom electronic module 400 and the standardized electronic module 410 are connected to the PCB 300. In another embodiment, both the custom electronic module 400 and the standardized electronic module 410 interface with the PCB 300 at one edge of the PCB 300. However, it should be appreciated that the custom electronic module 400 and the standardized electronic module 410 may interface with the PCB 300 in a variety of ways and still remain within the scope of the present invention.

The custom electronic module 400 includes a PCB including specialized electronics 401 and a connector 406. The custom electronic module 400 is used to implement unique test in the fixture. As a result, a wide variety of specialized test may be performed by the tester by implementing the PCB including specialized electronics 408 and then interfacing the PCB including specialized electronics 408 with the PCB 300. The PCB including specialized electronics 408 may include specialized electronics 401, such as a clock divider circuit, a power supply multiplexing circuit, etc. As a result, a wide variety of specialized test may be performed by the fixture. It should be appreciated that although specific specialized electronics 401 have been named and described in the instant application, a variety of specialized electronics may be implemented with the custom electronic module 400. In addition, any apparatus and/or method used to interface custom electronics, specialized electronics, and/or specialty testing in a wireless fixture through an interface module is within the scope of the present invention.

The standardized electronic module 410 includes a PCB including standardized electronics 418 and a connector 416. The standardized electronic module 410 is an interchangeable module; therefore, new standardized resources may be configured and implemented in the fixture by interchanging standardized electronic module 410 with another standardized electronic module 410, which is different from the first standardized electronic module 410. As such, a variety of standardized test may be performed by the fixture, simply by interchanging the standardized electronic module 410. The standardized electronic module 410 is used to implement standardized test in the fixture. As a result, a wide variety of standardized test may be performed by implementing the PCB including standardized electronics 418 and then interfacing the PCB including standardized electronics 418 with the PCB 300. The PCB including standardized electronics 418 may include standardized electronics 419, such as a capacitive testing multiplexer. As a result, a wide variety of test may be performed by the fixture. In addition, when performing test on different DUTs, the standardized testing may be implemented quickly and efficiently using the standardized electronic module 410. It should be appreciated that although specific standardized electronics have been named and described in the instant application, a variety of standardized electronics may be implemented with the standardized electronic module 410. In addition, any apparatus and/or method used to interface standardized electronics in a wireless fixture through an interface module are within the scope of the present invention.

Pin connector headers 402 and 412 are shown. In one embodiment, the pin connector headers 402 and 412 are mounted on the PCB 300. The pin connector header 402 includes pins 404. The pin connector header 412 includes pins 414. The pin connector headers 402 and 412 may be implemented with standardized pin connector headers or the pin connector headers 402 and 412 may be specifically designed for the application. In one embodiment, pin connector header 402 is used to connect the PCB 300 with the custom electronic module 400. In another embodiment, pin connector header 412 is used to connect the PCB 300 with the standardized electronic module 410. However, it should be appreciated that any connector, used to connect the PCB 300 with the custom electronic module 400 or with the standardized electronic module 410 are within the scope of the present invention.

The custom electronic module 400 includes a connector 406 and a PCB including specialized electronics 408. The custom electronic module 400 is an interchangeable module; therefore, new specialized resources may be configured and implemented in the fixture by interchanging custom electronic module 400 with another custom electronic module 400, which is different from the first custom electronic module 400. As such, a variety of specialized test may be performed by the fixture, by interchanging the custom electronic module 400. By connecting the pin connector header 402 to the connector 406, the specialized electronics 401 implemented on the PCB including specialized electronics 408 become accessible to the PCB 300 for use in the fixture. The standardized electronic module 410 includes a pin connector header 412 and a PCB including standardized electronics 418. By connecting the pin connector header 412 through the pins 414 to the connector 416, the standardized electronics 419 implemented on the PCB including standardized electronics 418 becomes accessible to the PCB 300 for use in the fixture.

Both the custom electronic module 400 and the standardized electronic module 410 become available as resources through traces 420 deployed in the PCB 300. The traces 420 route from the custom electronic module 400 and the standardized electronic module 410 to pads 422. It should be appreciated that while a few traces 420 are depicted, a variety of traces 420 are routed through the PCB 300 to a large array of pads 422 positioned at different locations in the PCB 300. The pads 422 are used to house double-ended probe receptacles 424 and 426. The double-ended probe receptacles 424 and 426 may then be inserted in mounting holes 428 located in load plate 302.

During configuration, pin connector headers (402, 412) are implemented in PCB 300. Fixture electronics modules, such as the custom electronic module 400 and the standardized electronic module 410, can then be installed by connecting connectors 406 and 416 to pin connector headers 402 and 412, respectively. The pins 404 and 414 in pin connector headers 402 and 412 are routed through wireless PCB 300 using traces 420. The traces 420 route to pads 422. Double-ended probe receptacles 424 and 426, such as double-ended probe receptacles with round pin tails (i.e., one end of the double-ended probe receptacles), are installed into load plate 302 using the mounting holes 428. In one embodiment, the double-ended probe receptacles 424 and 426 are mounted with the tails projecting into the pads 422. Double-ended probe receptacles 424 and 426, which contain an integral spring probe in one end and into the opposing end spring-mounted probes are installed, are installed into load plate 302 using the mounting holes 428. In one embodiment, the double-ended probe receptacles 424 and 426 are mounted with the integral probe ends positioned to contact the pads 422. The tester interface assembly 100 of FIG. 1 is then placed in a fixture receiver area of the tester. When a device interface assembly, such as device interface assembly 102 of FIG. 1 including a wireless PCB, such as wireless PCB 206 of FIG. 2, is placed on the tester interface assembly 100, the installed probes in the double-ended probe receptacles 424 and 426 of FIG. 4 then make contact with pad locations on the underside of wireless PCB 206 of FIG. 2.

Figure 5:
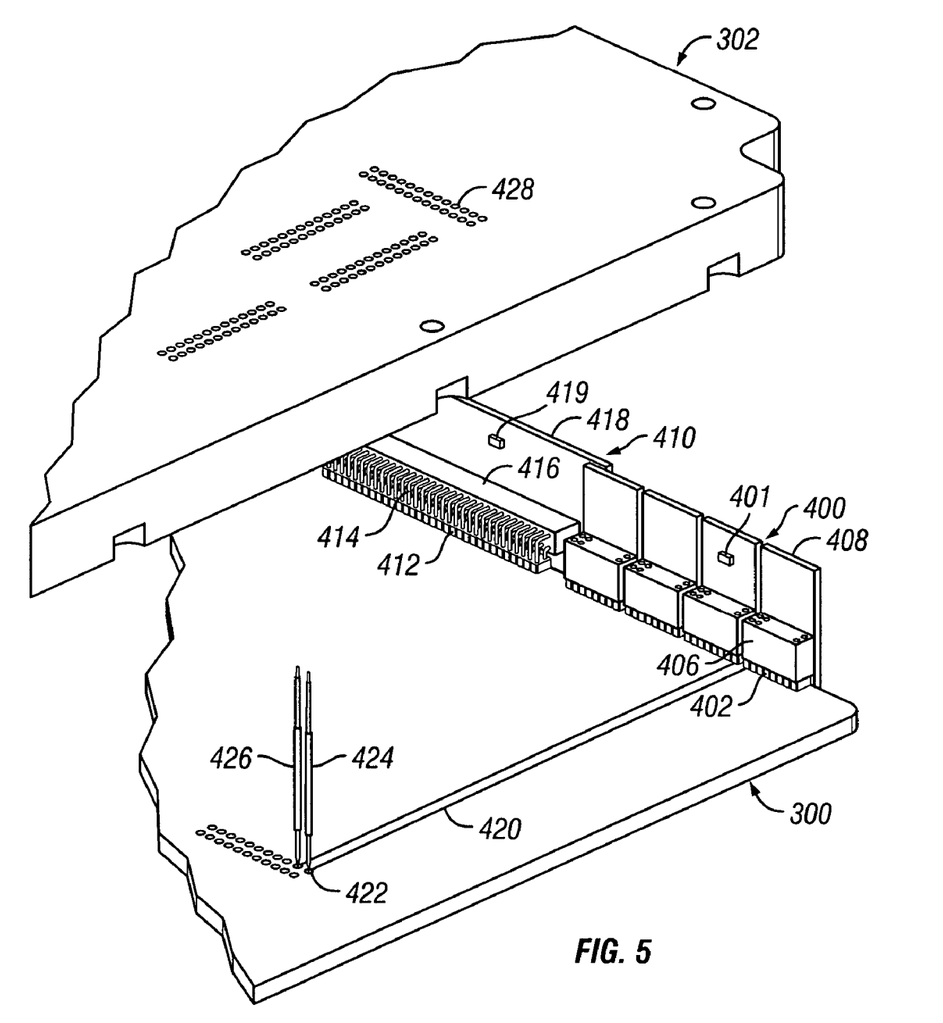
FIG. 5 is an exploded and connected view of the PCB and load plate shown as item 5 in FIG. 3.

FIG. 5 displays a connected assembly of the exploded view shown in FIG. 4. The custom electronic module 400 is connected to the PCB 300 using connector 406 and pin connector head 402. As such, the resources, circuits, custom electronics, etc. located in the PCB including specialized electronics 408 are accessible through the PCB 300. The standardized electronic module 410 is connected to the PCB 300 using connector 416 and pin connector header 412. As such, the resources, circuits, standardized electronics, etc. located in the PCB including standardized electronics 418 are accessible through the PCB 300. Resources provided by the custom electronic module 400 and standardized electronic module 410 may then be routed through a variety of traces 420 to a variety of pads 422. Double-ended probe receptacles 424 and 426 may then connect with the pads 422 and extend upward through the mounting holes 428 to a wireless PCB (i.e., not shown in FIG. 5).

In one embodiment, standardized functions and testing are performed by accessing the standardized electronic module 410. Standardized functions and testing routines are implemented using the standardized electronics 419 implemented in the PCB including standardized electronics 418. During operation, a communication path is established from the standardized electronics 419 implemented on the PCB including standardized electronics 418, through the connector 416, through the pin connector header 412, through the traces 420, through double-ended probe receptacles 426 and 428 and upward to the underside of a wireless PCB positioned in device interface assembly 102 of FIG. 1. The signals are routed through the wireless PCB, through a second set of double-ended probe receptacles to a DUT. A reverse path may also be established. As such, a two-way communication path is established between the DUT and the PCB including standardized electronics 418. As such, the standardized electronics 409 may be used to perform standardized test on the DUT.

In one embodiment, custom functions and testing are performed by accessing the custom electronic module 400. Custom functions and testing routines are implemented using the specialized electronics 401 implemented in the PCB including specialized electronics 408. During operation, signals are communicated from specialized electronics 401 implemented on the PCB including specialized electronics 408, through the connector 406, through the pin connector header 402, through the traces 420, through double-ended probe receptacles 424 and 426 and upward to the underside of a wireless PCB positioned in device assembly 102 of FIG. 1. The signals are routed through the wireless PCB, through a second set of double-ended probe receptacles to the DUT. A reverse path may also be established. As such, a two-way communication path is established between the DUT and the PCB including specialized electronics 408. As such, the specialized electronics 401 may be used to perform custom test on the DUT.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A fixture comprising:
   a first probe plate including a first probe field, the first probe plate capable of housing a plurality of double-ended probe receptacles in the first probe field;
   a wireless interface board including a topside and an underside, wherein the plurality of double-ended probe receptacles in the first probe field contact the wireless interface board on the topside;

a second probe plate including a second probe field, the second probe plate housing a plurality of double-ended probe receptacles in the second probe field, wherein the plurality of double-ended probe receptacles in the second probe field contact the wireless interface on the underside;

an interface board positioned below the second probe plate and in contact the plurality of double-ended probe receptacles in the second probe field; and a custom module coupled to the interface board, the custom module communicating test signals through the interface board to the plurality of double-ended probe receptacles in the second probe field.

2. A fixture as set forth in claim 1, wherein the custom module is interchangeable.

3. A fixture as set forth in claim 1, wherein the custom module further comprises an interface board including specialized electronics generating the test signals, and a connector coupling the interface board including the specialized electronics, the connector communicating the test signals to the interface board.

4. A fixture as set forth in claim 1, further comprising a standardized module coupled to the interface board, the standardized module communicating standardized test signals through the interface board to the plurality of double-ended probe receptacles in the second probe field.

5. A fixture comprising:

a plurality of double-ended probes in a first probe field;

a wireless interface board including a topside and an underside, wherein the plurality of double-ended probes in the first probe field contact the wireless Interface board on the topside;

a plurality of double-ended probes in a second probe field, the plurality of double-ended probes in the second probe field include a first end and an oppositely disposed second end, wherein the first end of the plurality of double-ended probes engage the wireless interface board on the underside;

an interface board in contact with the second end of the plurality of double-ended probes in the second probe field; and a custom module coupled to the interface board, the custom module communicating test signals through the interface board to the plurality of double-ended probes in the second probe field.

6. A fixture as set forth in claim 5, wherein the custom module is interchangeable.

7. A fixture as set forth in claim 6, wherein the custom module further comprises an interface board including specialized electronics generating the test signals, and a connector coupling the interface board including the specialized electronics, the connector communicating the test signals to the interface board.

8. A fixture as set forth in claim 6, further comprising a standardized module coupled to the interface board, the standardized module communicating standardized test signals through the interface board to the plurality of double-ended probes in the second probe field.

* * * * *

UNITED STATES PATENT AND TRADEMARK OFFICE
CERTIFICATE OF CORRECTION

PATENT NO.       : 7,009,381 B2
APPLICATION NO.  : 10/685327
DATED            : March 7, 2006
INVENTOR(S)      : Jacobsen et al.

It is certified that error appears in the above-identified patent and that said Letters Patent is hereby corrected as shown below:

In column 16, line 2, in Claim 5, delete "Interface" and insert -- interface --, therefor.

Signed and Sealed this

Third Day of October, 2006

JON W. DUDAS
*Director of the United States Patent and Trademark Office*